(12) United States Patent
Okahisa

(10) Patent No.: US 9,077,138 B2
(45) Date of Patent: Jul. 7, 2015

(54) SEMICONDUCTOR LASER DEVICE

(71) Applicant: NICHIA CORPORATION, Tokushima (JP)

(72) Inventor: Eiichiro Okahisa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 30 days.

(21) Appl. No.: 13/748,194

(22) Filed: Jan. 23, 2013

(65) Prior Publication Data

US 2013/0195134 A1  Aug. 1, 2013

(30) Foreign Application Priority Data

Jan. 26, 2012  (JP) .................................. 2012-13672

(51) Int. Cl.
*H01S 3/04*    (2006.01)
*H01S 5/022*   (2006.01)
*H01S 5/024*   (2006.01)

(52) U.S. Cl.
CPC ......... *H01S 5/02236* (2013.01); *H01S 5/02212* (2013.01); *H01S 5/024* (2013.01); *H01S 5/02469* (2013.01); *H01S 5/02476* (2013.01)

(58) Field of Classification Search
CPC . H01S 5/024; H01S 5/02236; H01S 5/02212; H01S 5/02476; H01S 5/02469

USPC ....................................................... 372/34, 36
See application file for complete search history.

(56) References Cited

U.S. PATENT DOCUMENTS 8,391,326 B1 *  3/2013  Tamaya et al. .................. 372/36
2006/0246615 A1 * 11/2006  Chang et al. .................... 438/26
2007/0160322 A1 *  7/2007  Ide et al. ......................... 385/24

FOREIGN PATENT DOCUMENTS

| JP | 6-84555 | | 3/1994 | |
|---|---|---|---|---|
| JP | 6-302912 | A | 10/1994 | |
| JP | 10-116943 | A | 5/1998 | |
| WO | WO 2009116133 | A1 * | 9/2009 | ............... H01S 3/04 |

* cited by examiner

*Primary Examiner* — Yuanda Zhang
(74) *Attorney, Agent, or Firm* — Foley & Lardner LLP

(57) ABSTRACT

A semiconductor laser device having stable heat dissipation property is provided. The semiconductor laser device includes a semiconductor laser element, a mounting body on which the semiconductor laser element is mounted, and a base body connected to the mounting body. The base body has a recess configured to engage with the mounting body and a through portion penetrating through a part of a bottom of the recess. In the specification, the remainder, which is a part of the bottom of the recess except for the through portion has a thickness equal or less than half of the largest thickness of the base body. The lowermost surface of the mounting body is spaced apart from the lowermost surface of the base body through the remainder.

21 Claims, 2 Drawing Sheets

SEMICONDUCTOR LASER DEVICE

CROSS-REFERENCE TO RELATED PATENT APPLICATIONS

This application claims priority to and the benefit of Japanese Patent Application No. 2012-013672, filed on Jan. 26, 2012, which is hereby incorporated by reference in its entirety.

BACKGROUND

1. Technical Field

The present disclosure relates to a semiconductor laser device.

2. Discussion of the Related Art

There has been known a semiconductor laser device in which a "heat sink" (corresponds to a "mounting member" in the present specification) having a "semiconductor laser element" mounted thereon is engaged in a through portion defined in a "stem" (corresponds to a "base member" in the present specification, as in JP H06-302912A). In JP H06-302912A, exposing the "heat sink" on a backside of the "stem" allows direct connection of the "heat sink" to an "external heat sink", which enables an improvement in its heat dissipation properties (see paragraph 10 of JP H06-302912A).

However, it is practically difficult to connect the lowermost surface of a mounting member and the lowermost surface of a substrate so as to be in the same plane. The mounting member and the substrate are connected with one another by using a solder material and applying heat, but due to a difference in the coefficient of thermal expansion between the mounting member and the substrate, the lowermost surface of the mounting member and the lowermost surface of the substrate tend to be on different planes. For this reason, although obtaining excellent heat dissipation is possible if the lowermost surface of the mounting member and the lowermost surface of the substrate can be arranged on the same plane, the heat dissipating properties significantly drops if the lowermost surfaces of both do not share the same plane. Thus, there has been a problem in which stable heat dissipating properties are difficult to obtain.

SUMMARY OF THE INVENTION

A semiconductor laser device according to an aspect of the present invention includes a semiconductor laser element, a mounting body on which the semiconductor laser element is mounted, and a base body connected to the mounting body. The base body has a recess configured to engage with the mounting body and a through portion penetrating a part of a bottom of the recess. The remainder, which is a part of the bottom of the recess except for the through portion, may have a thickness equal or less than half of the largest thickness of the base body. The lowermost surface of the mounting body may be spaced apart from the lowermost surface of the base body through the remainder.

DETAILED DESCRIPTION OF EMBODIMENTS

Embodiments of the present invention will be described below with reference to the drawings. The embodiments are intended as illustrative of a semiconductor laser device to give a concrete form to technical ideas of the present invention, and the scope of the invention is not limited to those described below. The sizes and the arrangement relationships of the members in each of drawings are occasionally shown exaggerated for ease of explanation.

Figure 1:
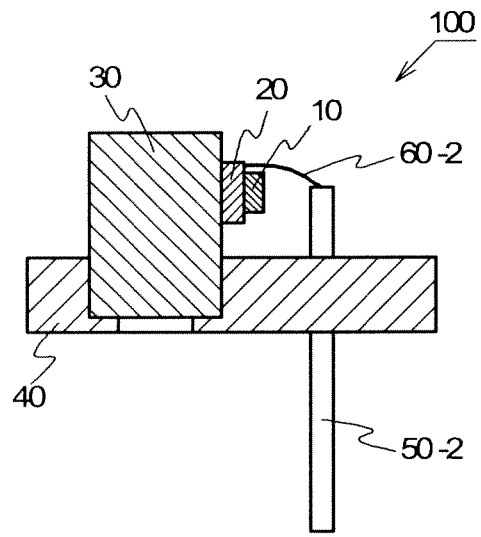
FIG. 1 is a cross-sectional view of a semiconductor laser device according to an embodiment of the invention.
Figure 2:
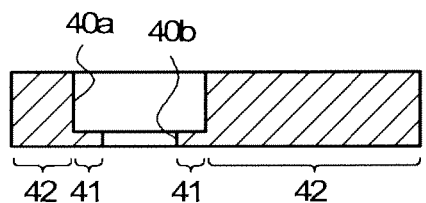
FIG. 2 is a cross-sectional view of a base body used for a semiconductor laser device according to an embodiment of the invention.
Figure 3:
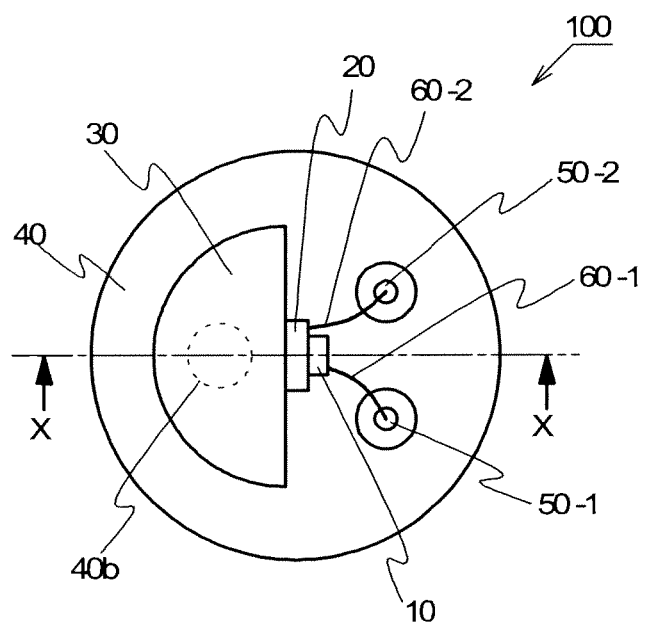
FIG. 3 is a plan view of a semiconductor laser device according to an embodiment of the invention.
Figure 4:
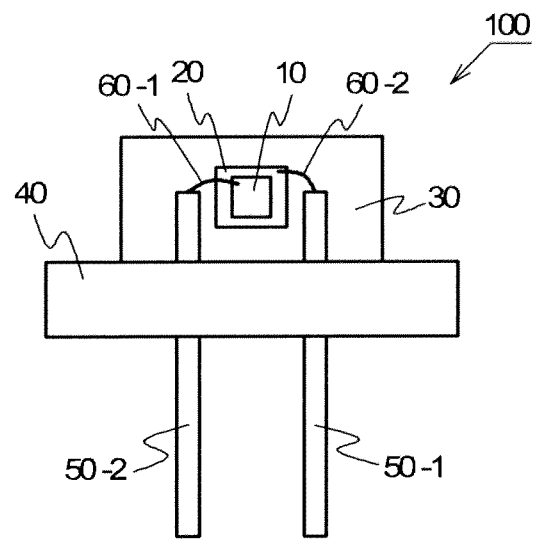
FIG. 4 is a side view of a semiconductor laser device according to an embodiment of the invention.

FIG. 1 shows a side cross-sectional view, FIG. 3 shows a plan view seen from above, and FIG. 4 is a side view seen from a right side in FIG. 1 and FIG. 3, respectively, of a semiconductor laser device 100 according to an embodiment of the present invention. Further, FIG. 1 is a cross-sectional view taken along line X-X of FIG. 3. FIG. 2 is a cross-sectional view of a base body 40 used in a semiconductor laser device 100.

As shown in the respective figures, the semiconductor laser device 100 includes a semiconductor laser element 10, a mounting body 30 on which the semiconductor laser element 10 is mounted, and a base body 40 connected to the mounting body 30. The base body 40 has a recess 40a configured to engage with the mounting body 30 and a through portion 40b penetrating a part of a bottom of the recess 40a. The remainder 41, which is a part of the bottom of the recess 40a except for the through portion 40b, may have a thickness equal or less than half of the largest thickness of the base body 40. The lowermost surface of the mounting body 30 may be spaced apart from the lowermost surface of the base body 40 through the remainder 41.

With this arrangement, a semiconductor laser device having stable and good heat dissipation property can be obtained. Hereinafter, embodiments will be described in detail.

Generally, for the mounting body, a metal material having a high thermal conductivity which allows an efficient dissipation of heat generated from the semiconductor laser element is used, but for the base body, a metal material having a thermal conductivity which is not too high may be selected so that a hermetic cap can be applied by welding or the like in a later manufacturing step. For this reason, the thermal conductivity of the base body is often lower than that of the mounting body. For this reason, it is considered to be preferable that the lowermost surface of the base body and the lowermost surface of the mounting body are arranged on a common plane which allows a direct contact of the mounting body and an external heat dissipation portion at the time of engaging the base body and the mounting body. Thus, heat generated from the semiconductor laser element can be released to external heat dissipation portion from both the mounting body and the base body. However, in practice, arrangement of the lowermost surfaces of the base body and the mounting body on a common plane is difficult to obtain due to the difference in the thermal expansion coefficient between the base body and the mounting body and a deviation in size.

For this reason, in the semiconductor laser device 100, the lowermost surface of the mounting body 30 is arranged on the remainder 41 so that the lowermost surface of the mounting body 30 is spaced apart from the lowermost surface of the base body 40. With this arrangement, the lowermost surface of the mounting body 30 is always located above the lowermost surface of the base body 40, so that variation in heat dissipation property among the devices can be reduced. With this arrangement fundamentally the region of the lowermost surface of the mounting body 30 corresponding to the through portion 40b do not contact to the external heat releasing portion, so that the heat dissipating property appears to be adversely affected. However, the remainder 41 located directly under the mounting body 30 has a relatively small thickness, so that a significant impairment of the heat dissipating property is unlikely to occur. Further, a part of the lowermost surface of the mounting body 30 is exposed from the base body 40 at the through portion 40b, so that even if a void (a gas cavity) occurs in the bonding member (e.g., a solder) used to connect the mounting body 30 and the base body 40, the gas void can be vented from the exposed portion through the through portion 40b. Thus, impairment of heat dissipation property due to remaining gas void in the bonding material can be avoided and more stable heat dissipation can be expected.

The main components of the semiconductor laser device 100 will be described below.

Semiconductor Laser Element 10

For the semiconductor laser element 10, a known semiconductor laser element can be used and, for example, a semiconductor laser element made of a nitride semiconductor can be used. The semiconductor laser element 10 has a p-electrode (not shown) and an n-electrode (not shown). In this embodiment, the p-electrode is disposed on a side of the semiconductor laser element 10 and the n-electrode is disposed on the other side of the semiconductor laser element 10.

For the semiconductor laser device 100, a multimode (lateral multimode) semiconductor laser element 10 can be used. A multimode semiconductor laser element has a relatively high output power, so that if there is a variation in the heat dissipation property among the devices, deterioration of the device due to heat starts to take place from devices having inferior heat dissipating property. Deterioration of a semiconductor laser element results in a decrease of output power, and in the worst case, results in the device being incapable of emitting light. Therefore, in the case where a multimode semiconductor laser element 10 is used for the semiconductor laser device according to the present embodiment having stable heat dissipation property, a significant effect can be obtained.

The lifetime of a semiconductor laser device is determined by the temperature of the semiconductor laser element. According to the findings by the inventor of the present invention, when the semiconductor laser device is in operation, the lifetime decreases by half when the temperature of the semiconductor laser device increases by 10° C. That is, if an increase of several degrees in the temperature of the semiconductor laser element can be avoided, the lifetime of the semiconductor element can be greatly improved. Particularly, a semiconductor laser element with high optical output power of several watts or greater inevitably generates a large amount of heat. Therefore, the present invention is very advantageous because there is much less variation among devices and an excellent heat dissipating property can be expected.

Mounting Body 30

The mounting body 30 is also called a heat sink, and used for mounting at least one semiconductor laser element 10. Also, heat generated from the semiconductor laser element 10 is first released into the mounting body 30, so that a metal material having an excellent heat dissipating property such as copper is often used for the mounting body 30. As shown in FIG. 1, a part of the mounting body 30 is protruded upwardly from the base body 40, and a semiconductor laser element 10 is fixed on a predetermined region of the protruded portion. As shown in FIG. 1, in the semiconductor laser device 100, the semiconductor laser element 10 is mounted on a side surface of the mounting body 30. Also, a different part of the mounting body 30 is engaged in the recess 40a formed in the base body 40, and thus the mounting body 30 and the base body 40 are connected with each other.

In the semiconductor laser device 100, an interposing body 20 (so-called sub mount) is interposed between the semiconductor laser element 10 and the mounting body 30. For example, employing the interposing body 20 having a thermal conductivity higher than that of the mounting body 30 allows releasing of heat generated from the semiconductor laser element 10 to the mounting body 30 efficiently. The use of an interposing body 20 made of an insulating material such as aluminum nitride, silicon carbide, silicon, and diamond allows for insulation between the semiconductor laser element 10 and the mounting body 30. In the embodiment, an interposing body 20 made of an insulating material is used to insulate between the semiconductor laser element 10 and the mounting body 30. Further, an electrically-conductive layer (not shown) is formed on the upper surface of the interposing body 20, and electric connection between the semiconductor laser element and outside is achieved through the electrically-conductive layer.

Base Body 40

The base body 40 is also called a stem or an eyelet and serves to connect the mounting body 30. Generally, a metal material such as iron having a lower heat dissipation property than that of the mounting body 30 is used for the base body 40. This may be because a cap (not shown) for hermetically sealing the base body 40 is needed to connect to the base body 40 by welding or the like in a later step of the procedure, and if the base body 40 has a thermal conductivity that is too high, heat will dissipate and the welding can not take place.

FIG. 2 is a cross-sectional view of a base body 40 used in a semiconductor laser device 100. The details of the base body 40 will now be described below with reference to FIG. 2. The base body 40 has a recess 40a formed in the upper surface and a through portion 40b penetrating in a thickness direction formed in the lower surface at a part of the lower surface under the recess 40a. In the embodiment, the thickness of the remainder 41, which is a part of the bottom of the recess 40a except for the through portion 40b is equal or less than half of the largest thickness of the base body 40 (the term "thickness" used herein refers to a thickness in thickness direction in FIG. 2). In FIG. 2, the region of the base body 40 other than the remainder 41 is indicated as the main portion 42. The main portion 42 has a thickness larger than that of the remainder 41; the remainder 41 has a thickness smaller than that of the main portion 42. Also, outermost surfaces of the main portion 42 and the remainder 41 share the same plane. That is, the remainder 41 is extended from the main portion 42 to form the recess 41a and the through portion 40b.

Press working, for example, can be employed to form the recess 40a and the through portion 40b in the base body 40. The following describes an example of a sequence of press-working. Firstly, a through-hole is formed in a base material. Next, using a mold having a protrusion, a depression is formed in a region which includes and is larger than the region where the through-hole is formed. At this time, the base material is pressed so as not to completely close the through-hole. Thus, the base body 40 having the recess 40a and the through portion 40b can be formed. That is, the portion in conformity with the protrusion of the mold forms the recess 40a and the portion of the through hole that stays open without being completely closed forms the through portion 40b. Pressing the base material so as not to completely close the through-hole allows thinner and stable formation of the reminder 41 by utilizing the ductility of the base material. In order to obtain the through portions 40b of a uniform size, the through portion 40b may be formed by removing a region slightly larger than the through-hole remaining after the pressing by way of punching or the like.

Figure 5:
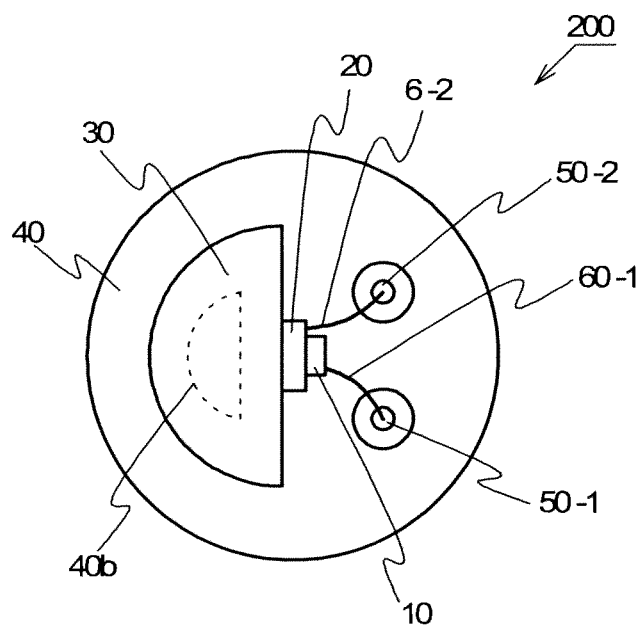
FIG. 5 is a plan view of a semiconductor laser device according to another embodiment of the invention.

In the semiconductor laser device 100, the through portion 40b is formed in a circular shape as seen from above (FIG. 3), but it is needless to say that the shape of the through portion 40b is not limited to a circular shape. For example, as in the semiconductor laser device 200 of another embodiment shown in FIG. 5, the through portion 40b may be formed in a shape which is substantially in conformity with the peripheral shape of the bottom of the recess 40a. With this arrangement, void occurred in the bonding member can be uniformly vented.

As shown in FIG. 3 etc., when viewed from above, the through portion 40b can be formed so that the exterior edge of the through portion 40b is spaced apart from the exterior edge of the bottom of the recess 40a. In other words, the remainder 41 can be extended from the entire circumference of the bottom of the recess 40a. With this arrangement, more uniform heat dissipation can be expected.

The thickness of the remainder 41 may be in a range from 5% to 30%, preferably in a range from 5% to 25%, more preferably in a range from 10% to 20% with respect to the largest thickness of the base body 40. If the thickness of the remainder 41 is too small, the remainder 41 may bend upward or downward due to the difference in thermal conductivity between the material of the base body 40 and the material of the mounting body 30, and which is undesirable in view of heat dissipation. This is because if the remainder 41 bends upward or downward, it results in a decrease of the area of contact between the base body and the external heat dissipating portion. Conversely, if the remainder 41 is too thick, the mounting body 30 having excellent heat dissipating property is separated from the lowermost surface of the base body 40 which likely impede overall heat dissipation.

When viewed from above, the area of the through portion 40b may be from 5% to 50%, preferably from 10% to 40%, more preferably from 10% to 30% with respect to the area of the bottom surface of the recess 40a. Arranging the ratio of the area of the through portion 40b with respect to the bottom surface to be larger than a certain level allows efficient venting of voids occurring in the bonding member, so that more stable heat dissipation can be achieved. Also, the ratio of the area of the through portion 40b with respect to the bottom surface is smaller than a certain level, so that a certain area can be provided for the remainder 41 and thus the heat dissipating property can be improved.

Lead Terminal

As shown in FIG. 4 etc., the semiconductor laser device 100 has a first lead terminal 50-1 and a second lead terminal 50-2 for supplying electricity to the semiconductor laser element 10. In this embodiment, the first lead terminal 50-1 and the second lead terminal 50-2 which are extended in the lateral direction are disposed to the base body 40 in the region different from the region where the recess 40a is formed. Each lead terminal is fixed to the base body 40 through an insulating material. The first lead terminal 50-1 is electrically connected to the upper surface side of the semiconductor laser element 10 through the first wire 60-1. The second lead terminal 50-2 is electrically connected to the lower surface side of the semiconductor laser element 10 through the second wire 60-2.

Examples

A semiconductor laser device was fabricated by using a semiconductor laser element 10 made of a nitride semiconductor and having an emission wavelength of 445 nm, an interposing body 20 made of aluminum nitride, a mounting body 30 including copper as its main component, and a base body 40 including iron as its main component. The mounting body 30 was connected to the base body 40 through a silver solder (bonding member).

The semiconductor laser element 10 has a p-electrode at the lower surface side (a side closer to the interposing body 20) and an n-electrode at the upper surface side (a side farther from the interposing body 20). As shown in FIG. 4, through the first wire 60-1, the n-electrode of the semiconductor laser element 10 and the first lead terminal 50-1 were electrically connected. Also, through the electrically conductive layer (not shown) formed on the surface of the interposing body 20 and the second wire 60-2, the p-electrode of the semiconductor laser element 10 and the second lead terminal 50-2 were electrically connected.

The recess 40a and the through portion 40b were formed in the base body 40 by pressing. As shown in FIG. 3 etc., in the plan view, the shape of the bottom of the recess 40a was semicircular and the shape of the through portion 40b was circular. The base body 40 was formed with a largest thickness (in the present example, the thickness of the main portion 42) of about 1.5 mm and the remainder 41 was formed with a thickness of about 0.3 mm. The area of the bottom of the recess 40a (corresponds to the area of the lowermost surface of the mounting body 30) was about 13 mm2 and in which, the area of the through portion 40b was about 2.5 mm2.

According the conditions of the semiconductor laser device fabricated as described above, the temperature increase was simulated with an amount of heat generation of 10 W and found to be 62.25° C. Also, under actual use conditions, grease may be filled in the through portion 40b to improve the heat dissipation, so that the temperature increase was simulated accordingly and found to be 62.07° C. That is, the semiconductor laser device having a structure according to the present example has stable heat dissipating property compared to that of comparative examples, and thus it is thought that the heat dissipation which is of equal practicality compared to the best of comparative examples can be obtained.

Comparative Example

The temperature increase was simulated under assumption of a semiconductor laser device having substantially similar construction as that of the example except that the lowermost surface of the mounting member 30 and the lowermost surface of the base body 40 were on the same plane, and found to be 60.49° C. However, in the case where the lowermost surface of the mounting member 30 was 30 μm higher than the lowermost surface of the base body 40, the temperature rise of the semiconductor laser element was simulated to be 71.2° C. Further, in the case where grease is filled in the through portion 40b in view of actual usage, the temperature rise of the semiconductor laser element as simulated to be stopped at 67.7° C.

What is claimed is:
1. A semiconductor laser device comprising:
a semiconductor laser element, a mounting body having the semiconductor laser element mounted thereon, and a base body connected to the mounting body;

wherein the base body comprises:
    a recess configured to engage with the mounting body, and
    a through portion penetrating through a part of a bottom of the recess,
wherein a remainder of the bottom, except the through portion, has a thickness of half or less than a maximum thickness of the base body,
wherein a lowermost surface of the mounting body is spaced apart from a lowermost surface of the base body through the remainder of the bottom,
wherein an entirety of the lowermost surface of the mounting body is located above an uppermost surface of the remainder, and
wherein the semiconductor laser element is mounted on the mounting body at a location above the uppermost surface of the remainder.

2. The semiconductor laser device according to claim 1, wherein the semiconductor laser element is a multi-mode semiconductor laser element.

3. The semiconductor laser device according to claim 1, wherein when viewed from above, the through portion is formed spaced apart from a periphery of the bottom.

4. The semiconductor laser device according to claim 1, wherein the thickness of the remainder of the bottom is 5% or greater and 30% or less of the maximum thickness of the base body.

5. The semiconductor laser device according to claim 1, wherein when viewed from above, an area of the through portion is 5% or greater and 50% or less of an area of the bottom.

6. The semiconductor laser device according to claim 1, wherein the base body includes iron.

7. The semiconductor laser device according to claim 1, wherein the mounting body includes copper.

8. The semiconductor laser device according to claim 1, wherein an interposing body is interposed between the semiconductor laser element and the mounting body.

9. The semiconductor laser device according to claim 8, wherein the interposing body is made of aluminum nitride.

10. The semiconductor laser device according to claim 2, wherein when viewed from above, the through portion is formed spaced apart from a periphery of the bottom.

11. The semiconductor laser device according to claim 2, wherein the thickness of the remainder of the bottom is 5% or greater and 30% or less of the maximum thickness of the base body.

12. The semiconductor laser device according to claim 2, wherein when viewed from above, an area of the through portion is 5% or greater and 50% or less of an area of the bottom.

13. The semiconductor laser device according to claim 2, wherein the base body includes iron.

14. The semiconductor laser device according to claim 2, wherein the mounting body includes copper.

15. The semiconductor laser device according to claim 2, wherein an interposing body is interposed between the semiconductor laser element and the mounting body.

16. The semiconductor laser device according to claim 15, wherein the interposing body is made of aluminum nitride.

17. The semiconductor laser device according to claim 1, wherein the mounting body is made of a single, integral body having a mounting surface on which the semiconductor laser element is mounted.

18. The semiconductor laser device according to claim 17, wherein the mounting surface is a flat surface that extends continuously from the uppermost surface of the remainder to a location above an uppermost surface of the base body.

19. The semiconductor laser device according to claim 18, wherein the mounting body includes a bottom surface that faces the uppermost surface of the remainder, a top surface opposing the bottom surface, the mounting surface extending from the bottom surface of the mounting body to the top surface of the mounting body, and a curved surface extending from the bottom surface of the mounting body to the top surface of the mounting body.

20. The semiconductor laser device according to claim 19, wherein the mounting body has a shape of a horizontal cylindrical segment.

21. A semiconductor laser device comprising:
    a semiconductor laser element, a mounting body having the semiconductor laser element mounted thereon, and a base body connected to the mounting body;
    wherein the base body comprises:
        a recess configured to engage with the mounting body, and
        a through portion penetrating through a part of a bottom of the recess,
    wherein a remainder of the bottom, except the through portion, has a thickness of half or less than a maximum thickness of the base body,
    wherein a lowermost surface of the mounting body is spaced apart from a lowermost surface of the base body through the remainder of the bottom,
    wherein an entirety of the lowermost surface of the mounting body is located above an uppermost surface of the remainder,
    wherein the mounting body is made of a single, integral body having a mounting surface on which the semiconductor laser element is mounted, and
    wherein the mounting surface is a flat surface that extends continuously from the uppermost surface of the remainder to a location above an uppermost surface of the base body.

* * * * *